(12) United States Patent
Siraky

(10) Patent No.: US 7,406,772 B2
(45) Date of Patent: Aug. 5, 2008

(54) DEVICE FOR MEASURING THE POSITION, THE PATH OR THE ROTATIONAL ANGLE OF AN OBJECT

(75) Inventor: Josef Siraky, Donaueschingen (DE)

(73) Assignee: Stegmann GmbH & Co. KG, Donaueschingen (DE)

( * ) Notice: Subject to any disclaimer, the term of this patent is extended or adjusted under 35 U.S.C. 154(b) by 860 days.

(21) Appl. No.: 10/798,781

(22) Filed: Mar. 12, 2004

(65) Prior Publication Data

US 2007/0180714 A1    Aug. 9, 2007

(30) Foreign Application Priority Data

Mar. 13, 2003 (DE) ................. 103 10 970

(51) Int. Cl.
*G01D 5/347* (2006.01)
*G01D 5/04* (2006.01)

(52) U.S. Cl. .............. 33/1 PT; 250/231.15; 250/231.18
(58) Field of Classification Search ............. 33/1 N, 33/1 PT, 706, 707, 708; 250/231.13, 231.14, 250/231.15, 231.17, 231.18; 356/616, 617
See application file for complete search history.

(56) References Cited

U.S. PATENT DOCUMENTS

| 4,572,951 A | 2/1986 | Toda et al. ............. 250/231.18 |
|---|---|---|
| 4,616,131 A * | 10/1986 | Burkhardt .............. 250/231.14 |
| 4,654,522 A * | 3/1987 | Gornick et al. ......... 250/231.18 |
| 4,712,088 A | 12/1987 | Ernst ............................. 341/2 |
| 4,730,110 A * | 3/1988 | Spaulding .............. 250/231.18 |
| 4,733,116 A | 3/1988 | Schulz ..................... 310/68 B |
| 5,640,007 A * | 6/1997 | Talbott et al. .......... 250/231.15 |
| 2006/0032062 A1* | 2/2006 | Besier et al. ................ 33/1 PT |

FOREIGN PATENT DOCUMENTS

| DE | 3415091 C | 7/1985 |
|---|---|---|
| DE | 4409892 A | 9/1995 |
| DE | 198 21 467 A1 | 11/1999 |
| EP | 0 046 232 A1 | 2/1982 |
| FR | 2 697 081 A1 | 4/1994 |
| JP | 55052910 A * | 4/1980 |

* cited by examiner

*Primary Examiner*—R. A. Smith
(74) *Attorney, Agent, or Firm*—The Nath Law Group; Jerald L. Meyer; Sung Yeop Chung

(57) ABSTRACT

A device for measuring the position, path, or rotational angle of an object exhibits a dimensional gauge that is connected to the object and that can be scanned. The dimensional gauge assigns measured values to the object's positional range, and these measured values repeat themselves cyclically in the object's successive positional ranges. The number of the completed measured value cycles is counted by an encoding unit with code disks (3, 4, 5), which exhibit an absolute angular encoding capability (34, 44, 54). The code disks (3, 4 or 4, 5) are arranged in succession and are coupled by a differential gear (21, 30, 40 or 22, 45, 50). The number of completed measured value cycles is determined from the reciprocal angular position of the code disks (3, 4, 5).

12 Claims, 4 Drawing Sheets

DEVICE FOR MEASURING THE POSITION, THE PATH OR THE ROTATIONAL ANGLE OF AN OBJECT

Figure 1:
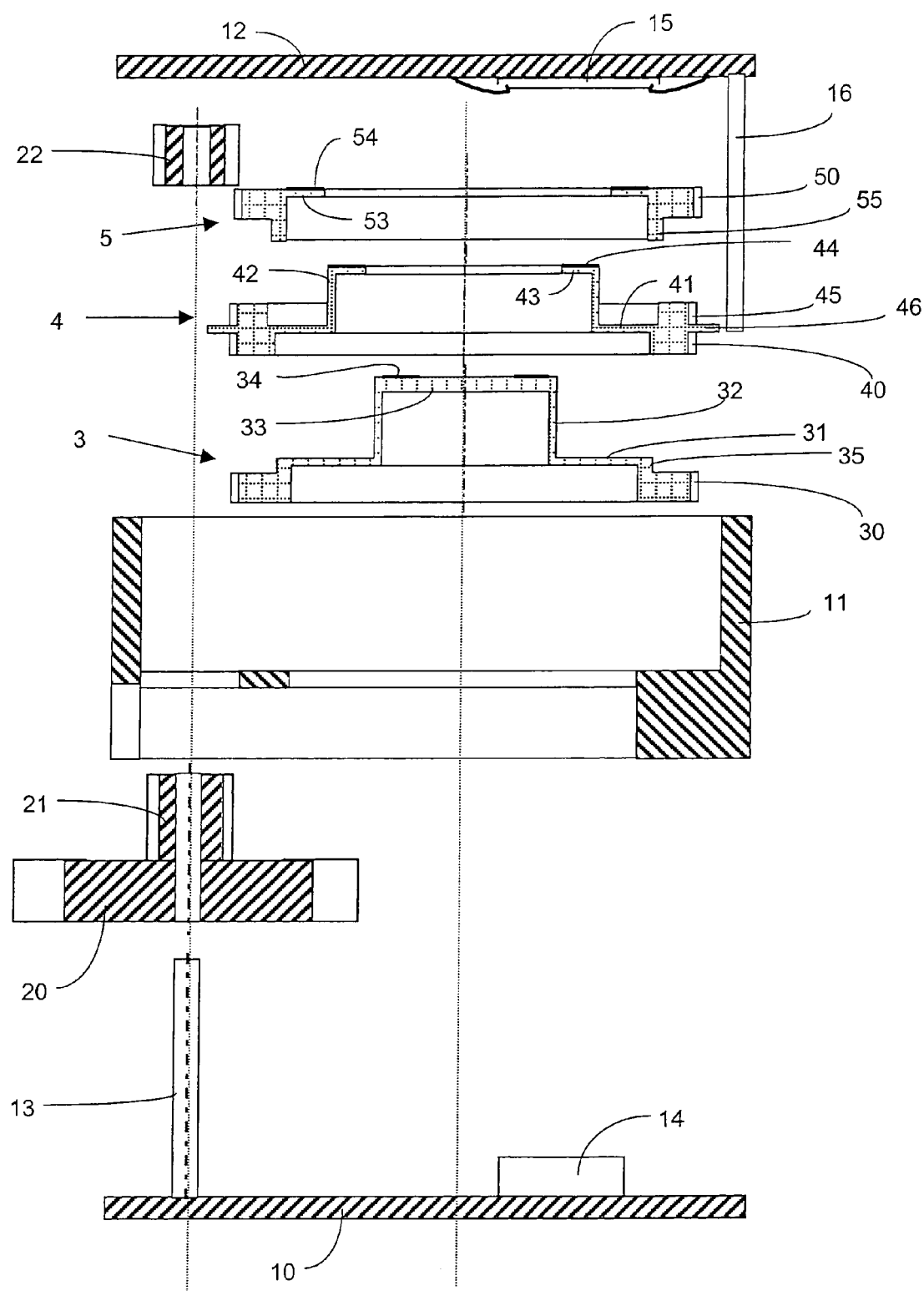

The invention relates to a device for measuring the position, path or rotational angle of an object in accordance with the preamble of claim 1.

For a number of applications it is necessary to measure the position of an object and/or the linear path or angle of rotation covered by an object relative to a reference system, e.g., in relation to another object. To this end, it is known to [the verb is missing in German original] a dimensional gauge with the object to be measured and to scan this dimensional gauge with a scanner connected to the reference system. In the case of an object moving in linear fashion the dimensional gauge can take the form of a ruler; when the object is a rotating one the dimensional gauge can take the form of the angular subdivision of a rotating disk. The dimensional gauge can be scanned optically in transmission or reflection, or can be scanned magnetically.

In many applications long paths or large angles of rotation must be measured for the object. To permit an absolute positional value to be obtained with a high degree of accuracy in such cases it is known to assign the dimensional gauge to a limited positional range and to repeat the measurement cyclically in successive positional ranges using the dimensional gauge. This principle is employed particularly in so-called multi-turn angular-rotation measuring devices, where the dimensional gauge is used to measure the angular position in absolute terms within one rotation, while an additional encoding unit determines the number of rotational cycles performed by the dimensional gauge.

In encoding the cycles it is known to use a reduction gear to transmit the motion of the dimensional gauge to the code disks, which display the number of cycles, ideally in absolutely encoded terms. In the known devices each code disk of the encoding units drives the following code disk by means of the reduction gear using a reduction ratio of $1:2^n$. Thus for each revolution of a code disk the next code disk will be turned a further angular increment, i.e., each code disk determines the complete revolutions of the code disk ahead. With a multi-level encoding unit the spatial requirement increases.

The goal of the invention is to elaborate a device of the initially indicated type in such a way that a large number of measured value cycles on the part of the dimensional gauge can be measured with a cost-effective design that provides a savings in space.

This goal is achieved by a device exhibiting the features as claimed.

Advantageous embodiments of the invention are indicated in the secondary claims.

The basic idea behind the invention consists in determining the measured value cycles of the dimensional gauge by means of an encoding unit—an encoding unit for which the successive code disks are coupled by a differential gearwheel. While in the prior art each code disk drives the next disk by means of a reduction gear, and thus each code disk counts the complete revolutions of the preceding code disk, in the device according to the invention two adjacent code disk are in each case driven by the same drive gear, although the two code disks have a different number of teeth, with the result that they turn at different speeds. The number of revolutions of the drive gear, and thus the number of completed measured value cycles of the dimensional gauge, is determined by the reciprocal angular position of the code disks according to the Nonius or Vernier principle.

The drive for the code disks using a differential gearwheel makes possible a particularly compact design for the encoding unit, since the code disks can be coaxially positioned. In a particularly advantageous version the code disks exhibit annular disks, which carry the code tracks of the angular encoding capability. These annular disks for all the code disks are positioned concentrically on a common plane. Connected to these annular disks are gearwheels of circular design. The gearwheels of the individual code disks are axially positioned against each other. The annular disks with the code tracks are located in the free space within the circular gearwheels, so that a shared light transmitter can illuminate the code tracks of all the code disks. A scanning capability can also be provided that covers the code tracks of all the code disks in radially overlapping fashion. The concentric arrangement of the code tracks of all the code disks, in combination with the axially stacked arrangement of the corresponding gearwheels, provides the encoding unit with an extraordinarily compact design. As a result it is even possible to design the encoding unit overall as an electronic component which can be soldered onto a printed circuit board (e.g., using SMD, chip-on-board, or ball grid technology).

The code disks, along with the annular disk carrying the code track and the gearwheel, can be manufactured as a single, injection-molded plastic part, resulting in particularly favorable manufacturing and assembling costs. In the following the invention will be described in greater detail on the basis of an embodiment depicted in the drawing. Shown are:

FIG. 1

The encoding unit in axial section in a general drawing

FIG. 2 an axial view of the assembled encoding unit

Figure 3:
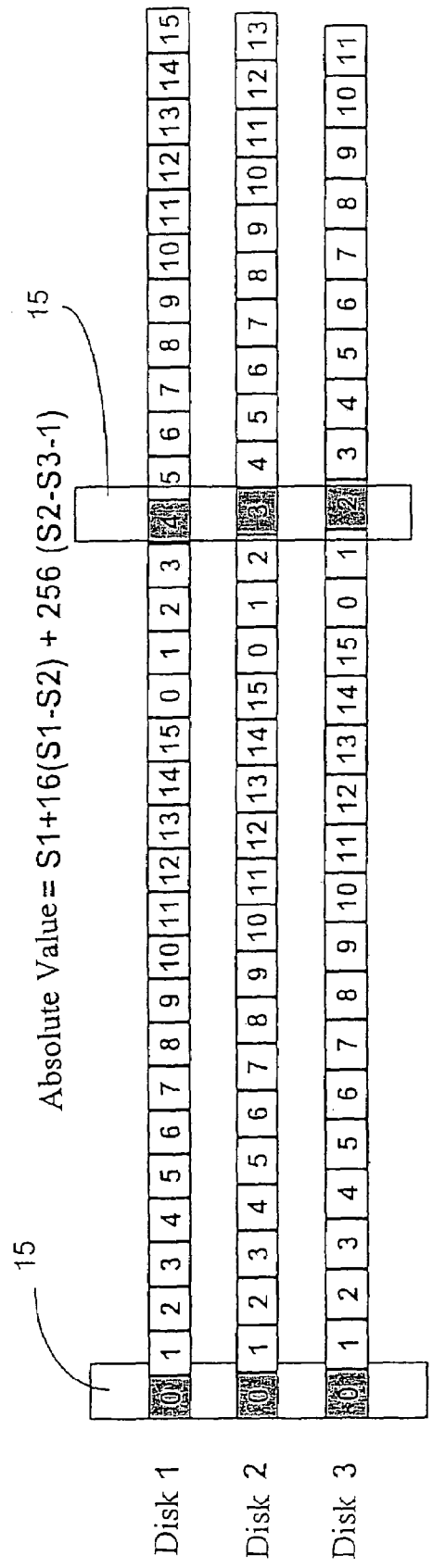
Figure 4:
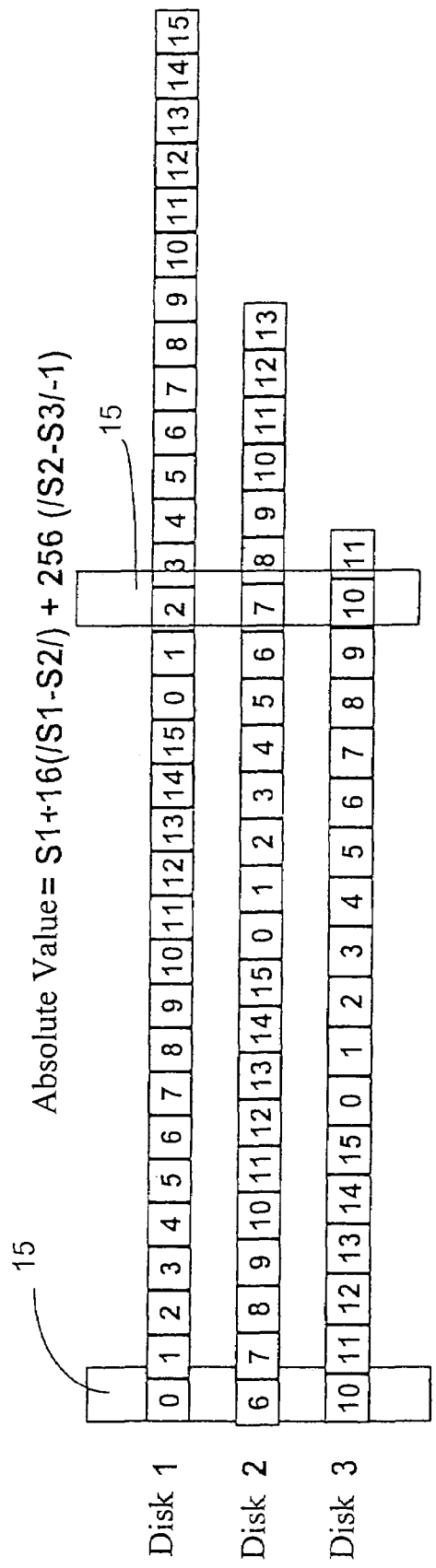

FIGS. 3 and 4 an explanatory depiction of the operating principle of the encoding unit.

The encoding unit shown in the drawing serves to provide an encoded determination of the number of measured value cycles completed by a dimensional gauge. For example, it is possible to determine the number of revolutions of the code disk that supports the dimensional gauge and belongs to a multi-turn rotational angle indicator.

The encoding unit exhibits a housing 1. This housing 1 consists of a base plate 10 in the form of a printed circuit board, a hollow cylindrical housing part 11 made of plastic and positioned on the base plate 10, and a cover plate 12 that closes off the housing part 11 on the front surface opposite the base plate 10 and that also takes the form of a printed circuit board.

Applied to the base plate 10 is a rotating axis 13, which projects into the housing part 11 parallel and eccentric to the axis of the housing part 11. Bordering the base plate 10 there is mounted on the rotating axis 13 an entry gearwheel 20 that turns freely and whose circumferential toothing projects out of the housing 1 and engages with toothing (not shown) connected to the dimensional gauge. Coaxially joined to form a single piece with the entry gearwheel 20 is a drive gear 21.

Three code disks 3, 4, 5 are mounted in the cylindrical housing part 11 in coaxial fashion and rest against each other axially. The code disks 3, 4, and 5 are each injection molded from transparent plastic in a single piece.

The first code disk 3, which lies closest to the base plate 10, exhibits a circular gearwheel 30, whose outer circumferential toothing engages with the first drive gear 21. From the gearwheel 30 a transparent annular disk 31 leads inward on a radial plane. The annular disk 31 supports a cylindrical section 32 oriented toward the cover plate 12. The cylindrical section 32 is sealed on its cover-plate end by a front plate 33. On its outer circumference the front plate 33 supports a circular code track 34.

The second code disk 4 which rests axially against the first code disk 3 exhibits a circular gearwheel 40, whose outer circumferential toothing also engages with the first drive gear 21. From the gearwheel 40 a transparent circular disk 41 supporting a cylindrical section 42 leads inward. The cylindrical section 42 projects toward the cover plate 12 and coaxially surrounds the cylindrical section 32 of the first code disk 3. On its cover-plate end the cylindrical section 42 carries an inner annular disk 43, on which a code track 44 is mounted. Another circular gearwheel 45 with outer toothing is axially positioned on the side of the gearwheel 40 facing the cover plate 12.

The third code disk 5, which rests axially against the second code disk 4, exhibits a circular gearwheel 50, whose inner circumference supports an annular disk 53, with a code track 54 applied to it.

Figure 2:
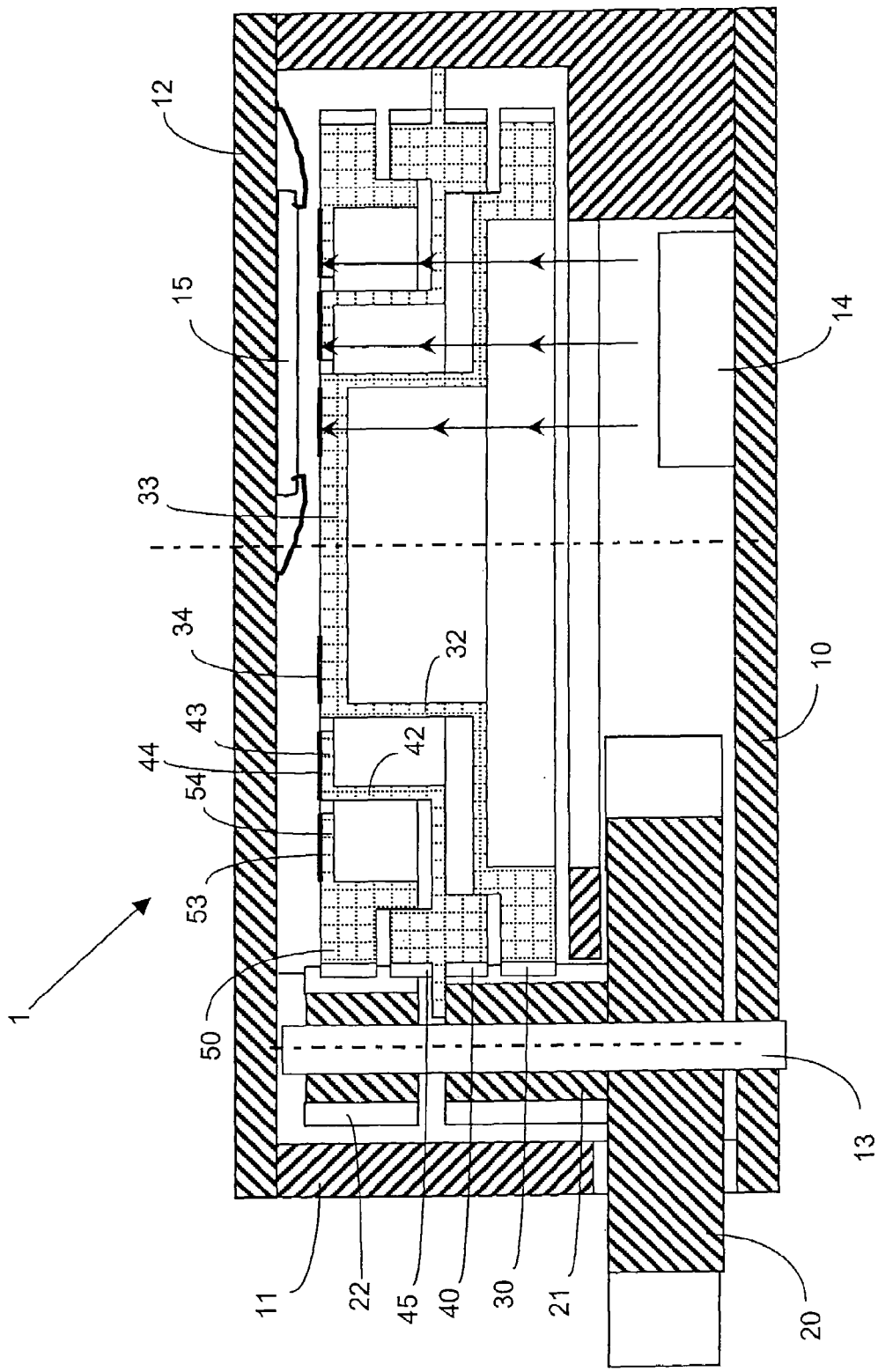

As can be seen FIGS. 1 and 2, the code disks 3, 4, and 5 are mounted against each other so as to turn freely. To this end the first code disk 3, by means of a shoulder 35 forming the transition from the gearwheel 30 to the annular disk 31, engages with the inner circumference of the gearwheel 40 of the second code disk 4. The cylindrical catch 55 of the third code disk 5 engages with the inner circumference of the gearwheel 45 of the second code disk 4.

A second drive gear 22 is located on the rotating axis 13, above the first drive gear 21. The second drive gear 22 is separated from the first drive gear 21 by an outer flange 46, which belongs to the second code disk 44 and which projects above gearwheels 40 and 45, so that the drive gears 21 and 22 can turn independent of each other. The outer toothing of the second drive gear 22 engages with the cover-plate side gearwheel 45 of the second code disk 4 and with the gearwheel 50 of the third code disk 5.

The front plate 33 of the first code disk 3, the annular disk 43 of the second code disk 4, and the annular disk 53 of the third code disk 5 rest concentrically on a common radial plane, as can be seen in FIG. 2. The code track 44 of the second code disk 4 rests concentrically against the outer circumference of the code track 34 of the first code disk 3. The code track 54 of the third code disk 5 rests concentrically against the outer circumference of the code track 44 of the second disk 4.

The first drive gear 21 drives the first code disk 3 and the second code disk 4 by means of the corresponding gearwheels 30 and 40 in the manner of a differential gear drive. To this end the gearwheel 40 of the second code disk 4 has a greater number of teeth than the gearwheel 30 of the first code disk 3. In the depicted exemplary embodiment the first drive gearwheel has 15 teeth, the gearwheel 30 of the first code disk 3 has 60 teeth, and the gearwheel 40 of the second code disk 4 has 64 teeth.

In corresponding fashion, the second code disk 4 drives the third code disk 5 in the manner of a differential gear drive. To this end the cover-plate side gearwheel 45 has fewer teeth than the gearwheel 50 of the third code disk 5. In the depicted exemplary embodiment the second drive gearwheel 22, which engages with gearwheels 45 and 50, has fifteen teeth, and the cover-plate side gearwheel 45 of the second code disk 4 has 60 teeth, and the gearwheel 50 of the third code disk 5 has 64 teeth.

Positioned on the base plate 10 is a light transmitter 14, which is fed by conducting lines formed on the base plate 10. The light transmitter 14 is positioned eccentric to the axis of the housing part 11 and the code disks 3, 4, and 5, so that its bundled light illuminates the code tracks 34, 44, and 54. Positioned on the cover plate 12, above the code tracks 34, 44, and 54, is a scanning unit 15, which exhibits photosensitive sensors formed on a semiconductor chip. The semiconductor chip of the scanning unit 15 can be applied as an SMD element or chip-on-board to the cover plate 12, which is designed as a printed circuit board. Electrical lines 16 connect the printed circuit board of the base plate 10 to the printed circuit board of the cover plate 12.

The code tracks 34, 44, and 54 of the code disks 3, 4, and 5 will ideally take an absolute form of encoding; each code track 34, 44, and 54 is divided into 32 angular increments in a pseudo-random code. The angular increments are scanned with at least 2×5 bit, so that there is a redundancy. When the scanning unit is turned on it is thus possible to read the angular value x and the angular value x+n (=at least 1) of each code track 34, 44, 54, and this guarantees an almost faultless scanning of the absolute value of the angular position of the code disks 3, 4, and 5 when the scanning is turned on.

The operation of the encoding system is will next be explained on the basis of FIGS. 3 and 4.

The first drive gear 21, which the dimensional gauge drives by means of the entrance gearwheel 20 and which has 15 teeth, drives both the first code disk 3, via the latter's gearwheel 30 of 60 teeth and drives the second code disk 4 via the latter's gearwheel of 64 teeth. Thus after four revolutions of the entrance gearwheel 20 the first code disk 3 has executed one complete revolution. The second code disk 4, in keeping with its greater number of teeth, turns $\frac{1}{16}$ more slowly than the first code disk 3. Since the second code disk 4, with gearwheel 45 and its 60 teeth, engages with the second drive gear 22 with 15 teeth, and since this second drive gear 22, with its 15 teeth, in turn engages with the gearwheel 50, with its 64 teeth, belonging to the third code disk 5, the third code disks 5 turns $\frac{1}{16}$ more slowly than the second code disk 4.

The absolute value of the encoding unit can thus be calculated from the value S1 of the code track 34 of the first code disk 3, plus 16 times the difference between the values S1 of the code track 34 of the first code disk and S2 of the code track 44 of the second disk 4, plus 256 times the difference between the values S2 of the code track 44 of the second code disk 4 and S3 of the code track 54 of the third code disk 5. FIG. 3 shows the zero position of the encoding unit, where the code tracks 34, 44, and 54 of the three code disks 3, 4, and 5 each have a value of 0. The right scanning corresponds to a value of 20 measured value cycles. FIG. 4 shows other examples, where the result is 864 and 594 measured value cycles.

It is obvious that in place of three code disk 3, 4, and 5 it is possible to use only three code disks, or more than 3 code disks, with each of the adjoining code disks being coupled by a differential gear drive. In this way the counting range of the encoding unit can be adjusted to the actual demands.

It is also evident that the invention is not limited to the number of teeth—15, 60, and 64—indicated in the depicted exemplary embodiment.

Other combinations of teeth number are possible and will result in a modified utilization.

LIST OF REFERENCE NUMERALS 1 housing
3 first code disk
4 second code disk
5 third code disk
10 base plate
11 housing part 12 cover plate
13 rotating axis
14 light transmitter
15 scanning unit
16 connection
20 entry gearwheel
21 first drive wheel
22 second drive wheel
30 gearwheel
31 annular disk
32 cylindrical section
33 front plate
34 code track
35 shoulder
40 gearwheel
41 annular disk
42 cylindrical section
43 annular disk
44 code track
45 gearwheel
46 outer flange
50 gearwheel
53 annular disk
54 code track
55 cylindrical catch

The invention claimed is:

1. Device for measuring the position, the path or the angle of rotation of an object, comprising a scannable material measure which can be connected to the object and assigns measurement values to a position range of the object, these measurement values being cyclically repeated in successive position ranges of the object, and comprising a coding unit, which codes the number of passed-through measurement value cycles and has at least two code discs driven via reduction gears of the material measure, wherein the code discs (3, 4, 5) have an absolute angle coding (34, 44, 54), wherein the code discs (3, 4, 5) are coaxially disposed and have axially mutually offset gears (30, 40, 45, 50), wherein the respectively successive code discs (3, 4 and 4, 5) are coupled in such a way by a differential gearing (21, 30, 40 and 22, 45, 50) that they are jointly driven by means of a drive gear (21 and 22) and their gears (30, 40, 45, 50) respectively have different tooth numbers, and wherein the number of passed-through measurement value cycles is determined from the mutual angular position of the code discs (3, 4, 5), characterized in that the gears (30, 40, 45, 50) of all of the code discs (3, 4, 5) are of annular configuration, in that the code discs are mounted one against the other such that they are freely rotatable, in that the code tracks (34, 44, 54) of the angle codings of the code discs (3, 4, 5) are located in a single plane on concentrically disposed annular discs (33, 43, 53) in the free interior of the gears (30, 40, 45, 50), and in that the code tracks (34, 44, 54) of all code discs (3, 4, 5) are irradiated by a joint light transmitter (14) with light path running in the free interior of the gears (30, 40, 45, 50) and are scanned by a scanner (15) radially sweeping the code tracks (34, 44, 54) of all of the code discs (3, 4, 5).

2. Device according to claim 1, characterized in that two of the gears (30, 40 and 45, 50) of the respectively successive code discs (3, 4 and 4, 5) are driven by the joint drive gear (21 and 22), which at the outer periphery engages the two gears (30, 40 and 45, 50) and extends axially over the two gears (30, 40 and 45, 50).

3. Device according to claim 1, characterized in that the light transmitter (14) is disposed on a base plate (10) supporting the mounting of the code discs (3, 4, 5) and of the drive gears (21, 22), and in that the scanner (15) is disposed on a cover plate (12) placed opposite the base plate (10).

4. Device according to claim 3, characterized in that the base plate (10) and the cover plate (12) are configured as printed circuit boards.

5. Device according to claim 3, characterized in that the base plate (10) and the cover plate (12) close off axially at both ends a housing part (11), which accommodates the code discs (3, 4, 5).

6. Device according to claim 1, characterized in that the code discs (3, 4, 5) with their respective gears (30, 40, 45, 50) and their annular discs (33, 43, 53) bearing the code tracks (34, 44, 54) are one-piece injection mouldings made of a light-transparent plastic.

7. Device according to claim 1, characterized in that the complete coding unit is configured as an electronic component, which is suitable for the assembly of printed circuit boards.

8. Device according to claim 1, characterized in that the gear reduction ratios with which two respectively successive code discs (3, 4 and 4, 5) are driven differ by $\frac{1}{2}''$.

9. Device according to claim 8, characterized in that the drive gears (21, 22) respectfully have 15 teeth and one code disc has 60 teeth and the other 64 teeth.

10. Device according to claim 8, characterized in that the coding unit has three of the code discs (3, 4, 5), so that 4096 measurement value cycles can be counted.

11. Device according to claim 1, characterized in that the code discs (3, 4, 5) respectively have an absolutely coded angle scale comprising 32 angular steps.

12. Device according to claim 11, characterized in that the coding of the angle scale is formed by a pseudo random code having respectively at least 2×5 bits.

* * * * *